(12) United States Patent
Ozawa et al.

(10) Patent No.: US 7,081,386 B2
(45) Date of Patent: Jul. 25, 2006

(54) SEMICONDUCTOR DEVICE AND METHOD OF MANUFACTUING THE SAME

(75) Inventors: Yoshio Ozawa, Yokohama (JP); Shigehiko Saida, Yokkaichi (JP); Yuji Takeuchi, Yokohama (JP); Masanobu Saito, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 10/812,987

(22) Filed: Mar. 31, 2004

(65) Prior Publication Data

US 2004/0256660 A1 Dec. 23, 2004

(30) Foreign Application Priority Data

May 27, 2003 (JP) ............................. 2003-149335

(51) Int. Cl.
*H01L 21/336* (2006.01)
(52) U.S. Cl. .................. 438/259; 438/197; 438/257; 438/264; 438/294
(58) Field of Classification Search ................ 438/197, 438/257, 259, 264, 294
See application file for complete search history.

(56) References Cited

U.S. PATENT DOCUMENTS

| | | |
|---|---|---|
| 6,294,481 B1 | 9/2001 | Inumiya et al. |
| 6,342,715 B1 * | 1/2002 | Shimizu et al. ............. 257/314 |
| 6,383,856 B1 | 5/2002 | Inumiya et al. |
| 6,448,126 B1 * | 9/2002 | Lai et al. .................... 438/216 |
| 6,555,427 B1 * | 4/2003 | Shimizu et al. ............. 438/238 |
| 6,787,410 B1 * | 9/2004 | Iwata et al. ................. 438/221 |
| 6,818,508 B1 * | 11/2004 | Shimizu et al. ............. 438/257 |
| 6,887,758 B1 * | 5/2005 | Chindalore et al. ......... 438/257 |
| 2002/0090830 A1 | 7/2002 | Inumiya et al. |
| 2003/0057475 A1 * | 3/2003 | Mori .......................... 257/324 |

FOREIGN PATENT DOCUMENTS

| | | |
|---|---|---|
| JP | 5-75135 | 3/1993 |
| JP | 6-204494 | 7/1994 |
| JP | 7-86438 | 3/1995 |
| JP | 8-130258 | 5/1996 |
| JP | 10-22403 | 1/1998 |
| JP | 11-111872 | 4/1999 |
| JP | 11-204788 | 7/1999 |
| JP | 2000-124430 | 4/2000 |
| JP | 2000-174275 | 6/2000 |
| JP | 2002-134634 | 5/2002 |

OTHER PUBLICATIONS

Notification of Reasons for Rejection (Office Action) for Japanese Patent Application No. 2003-149335, mailed Jul. 5, 2005 and English translation thereof.
Final Notice of Rejection (Office Action) for Japanese Patent Application No. 2003-149335, mailed Feb. 7, 2006 and English translation thereof.

* cited by examiner

*Primary Examiner*—Zandra V. Smith
*Assistant Examiner*—Thanh Y. Tran
(74) *Attorney, Agent, or Firm*—Finnegan, Henderson, Farabow, Garrett & Dunner, L.L.P.

(57) ABSTRACT

A semiconductor device comprises a semiconductor substrate, and a non-volatile memory cell provided on the semiconductor substrate, the non-volatile memory cell comprising a tunnel insulating film having a film thickness periodically and continuously changing in a channel width direction of the non-volatile memory cell, a floating gate electrode provided on the tunnel insulating film, a control gate electrode provided above the floating gate electrode, and an interelectrode insulating film provided between the control gate electrode and the floating gate electrode.

16 Claims, 7 Drawing Sheets

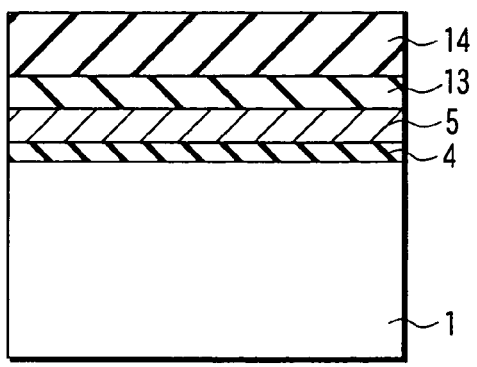
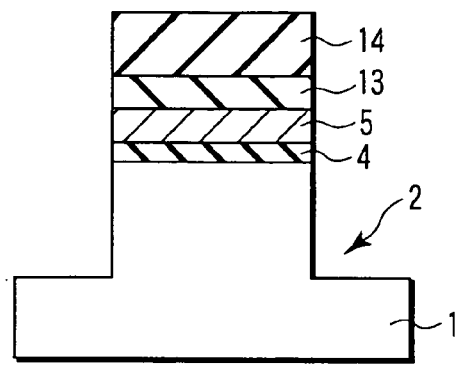
FIG. 3A FIG. 3B
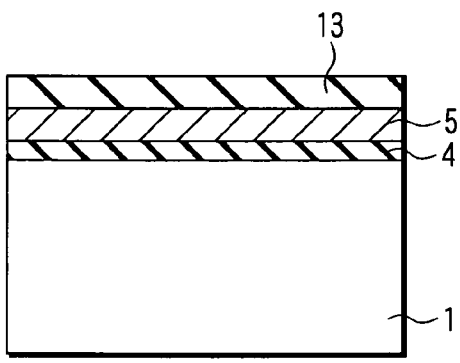
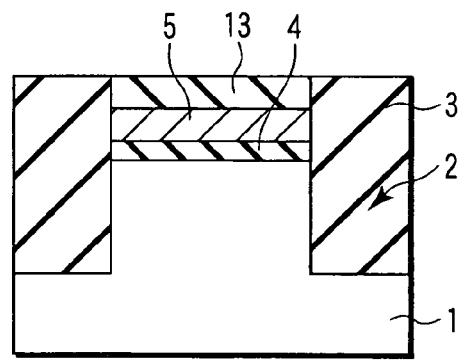
FIG. 4A FIG. 4B
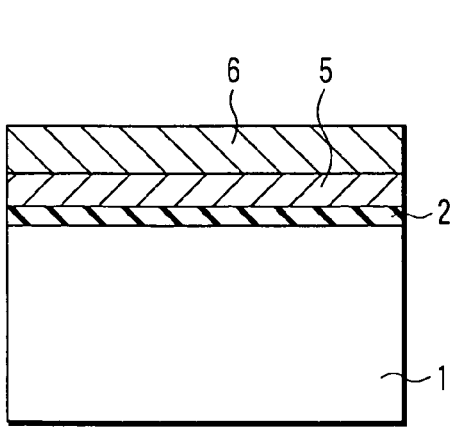
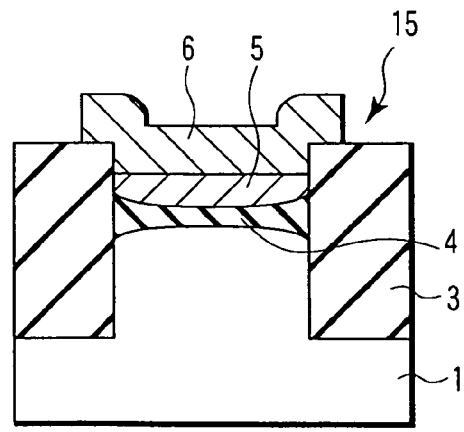
FIG. 5A FIG. 5B

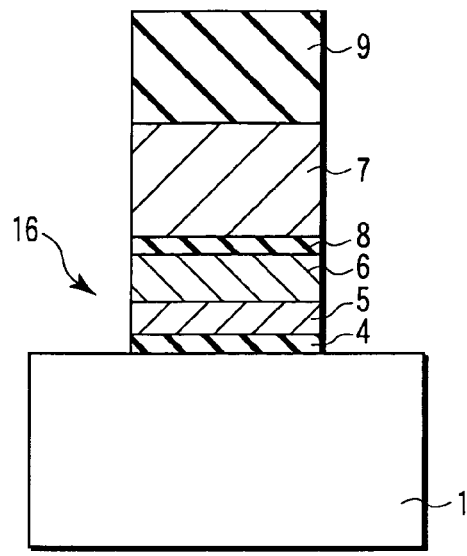
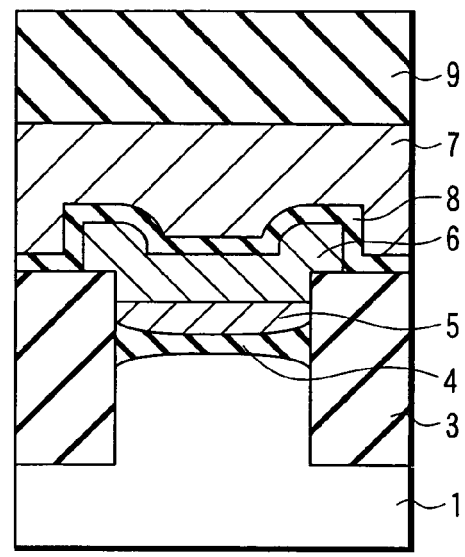
F I G. 6A       F I G. 6B
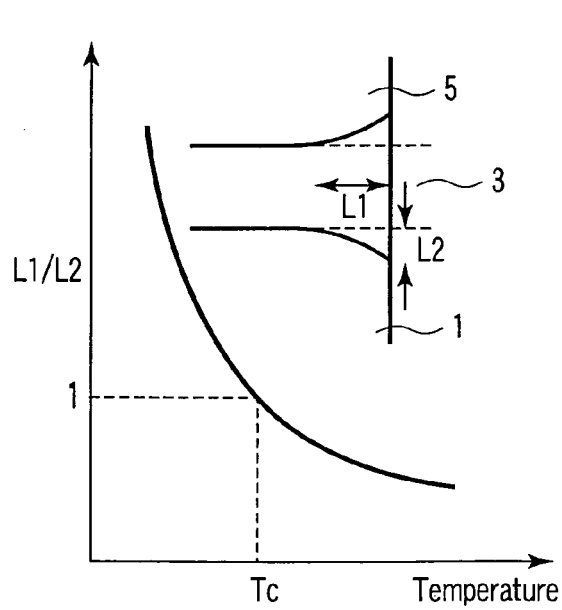
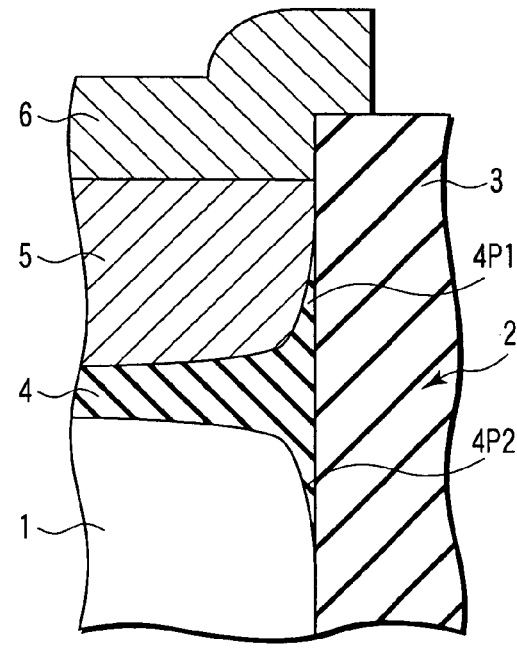
F I G. 7       F I G. 8

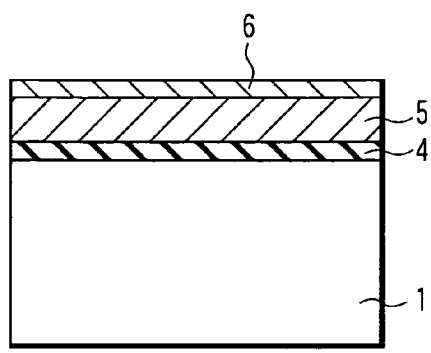
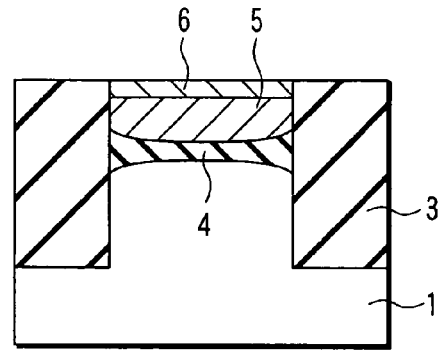
F I G. 12A    F I G. 12B
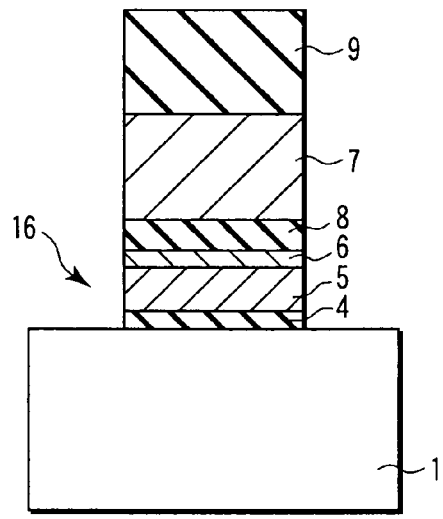
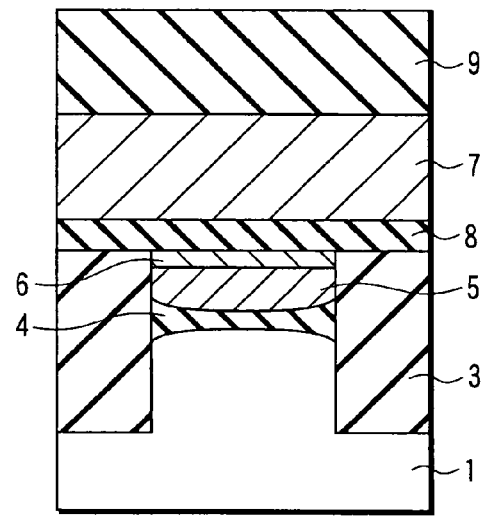
F I G. 13A    F I G. 13B
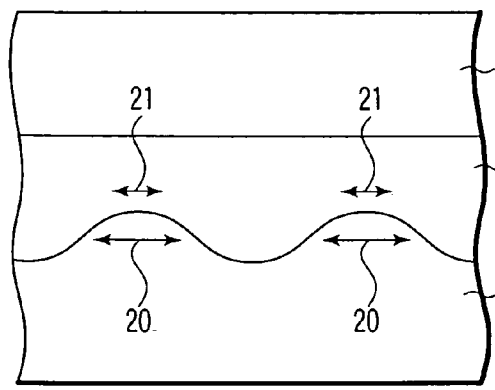
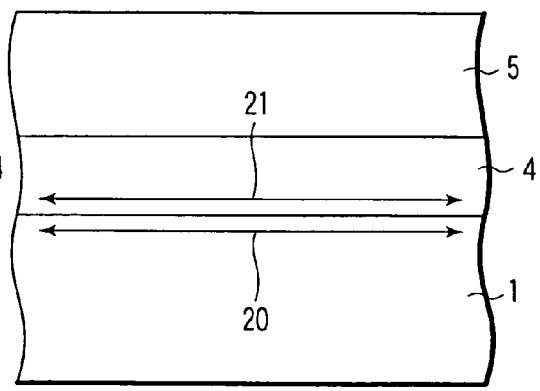
F I G. 14    F I G. 15 (PRIOR ART)

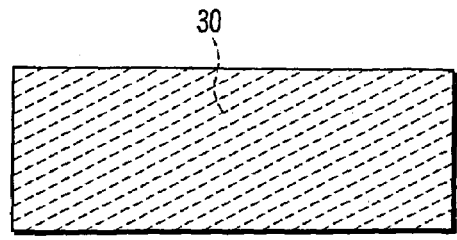
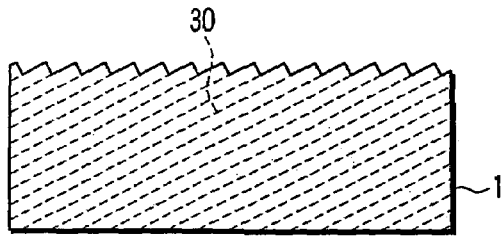
FIG. 16A  FIG. 16B
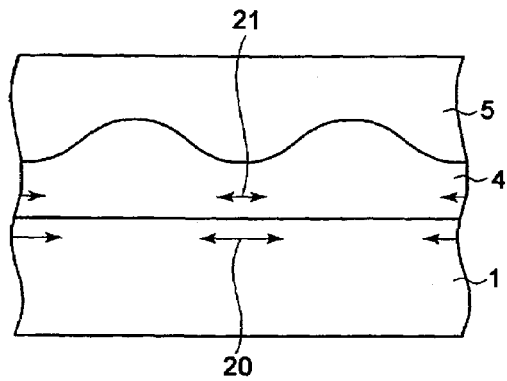
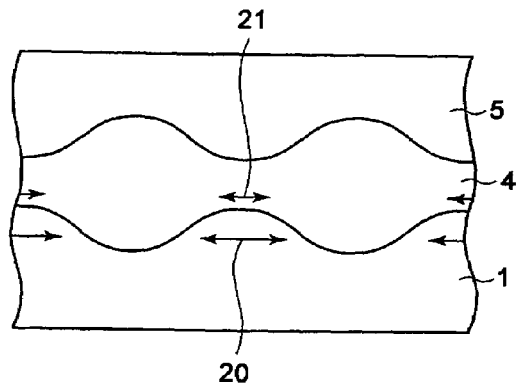
FIG. 17A  FIG. 17B
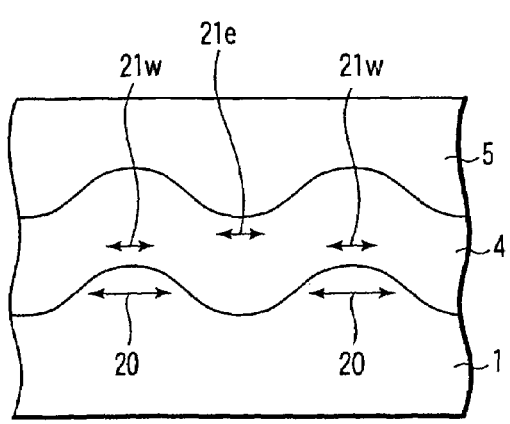
FIG. 18
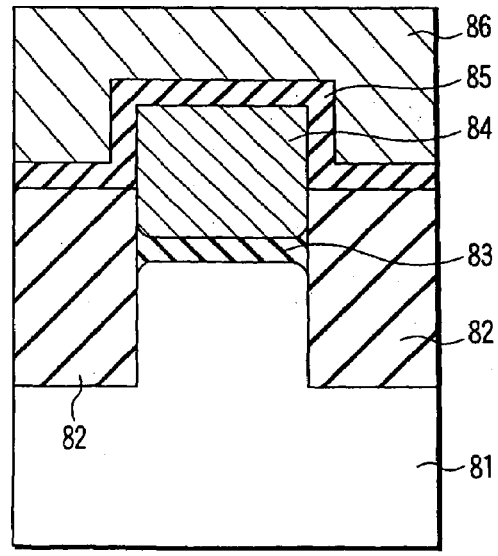
FIG. 19 (PRIOR ART)

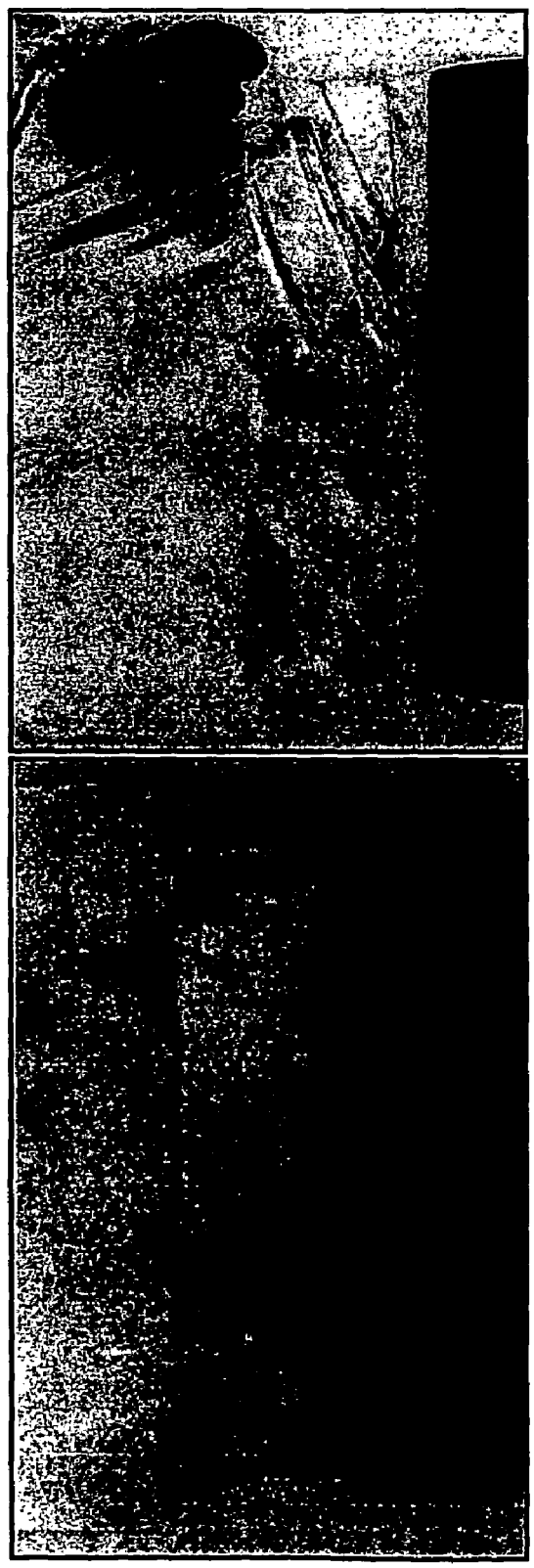

SEMICONDUCTOR DEVICE AND METHOD OF MANUFACTUING THE SAME

CROSS-REFERENCE TO RELATED APPLICATIONS

This application is based upon and claims the benefit of priority from prior Japanese Patent Application No. 2003-149335, filed May 27, 2003, the entire contents of which are incorporated herein by reference.

BACKGROUND OF THE INVENTION

1. Field of the Invention

The present invention relates to a semiconductor device including a non-volatile memory cell, and to a method of manufacturing the same.

2. Description of the Related Art

FIG. 19 schematically shows the sectional structure of a conventional non-volatile memory cell in the channel width direction (i.e., a direction perpendicular to a direction channel current flows) (see JPN. PAT. APPLN. KOKAI publication No. 2002-134634). In FIG. 19, reference numerals 81, 82, 83, 84, 85 and 86 denote silicon substrate, isolation film, tunnel insulating film, floating gate electrode, interelectrode insulating film, and control gate electrode, respectively.

The tunnel insulating film 83 has a nearly flat surface and almost uniform in thickness except in the vicinity of the boundary with the isolation film 82. In other words, the tunnel insulating film 83 has a substantially same shape except the vicinity of the boundary with the isolation film 82.

In the vicinity of the boundary between the tunnel insulating film 83 and the isolation film 82, thickness of the tunnel insulating film 83 is thicker than other portions of the tunnel insulating film 83. The reason is that each surface of the silicon substrate 81 exposed on the sidewall of isolation trench and the floating gate electrode 84 is oxidized by thermal oxidation process conducted before the isolation trench is filled with the isolation film 82.

In the thermal oxidation process, the tunnel insulating film 83 is thicken in the region within about 5 nm inside from the boundary with the isolation film 82. In the write/erase operation tunnel current flows through almost whole the tunneling region as long as the film thickness increases to the degree described above. Namely, the tunnel current flows through the nearly entire region except in the vicinity of the boundary between the tunnel insulating film 83 and the isolation film 82.

The tunnel insulating film 83, in particular, the portion close to the vicinity of the boundary with the isolation film 82, receives so-called process damages more during manufacturing process than other portion. The process damages are metal contamination, halogen contamination, ion bombardment or charging damage. The process damages degrade the film quality of tunnel insulating film 83, in particular, the portion close to the vicinity of the boundary with the isolation film 82.

When the tunnel current flows through the tunnel insulating film 83, the degration of the film quality causes the following disadvantage. The generation of charge traps in the tunneling insulating film 83 or leakage current through the tunneling insulating film 83 remarkably increases near the boundary with the isolation film 82. The increase of the generation of charge traps or leakage current causes malfunction or reduction of charge storage capability due to the variations of threshold voltage in memory cells.

In the silicon substrate 81, the following regions are nearly the same (approximately entire regions of the tunnel insulating film 83 except in the vicinity of the boundary with the isolation film 82). One is a region through which tunnel current flows in the write/erase operation. Another is a region through which channel current flows in the cell transistor operation.

When the tunnel current flows through the tunnel insulating film 83, charge traps or interface states are generated in the tunnel insulating film 83. When charge traps or interface states are generated therein, the quality of the tunnel insulating film 83 deteriorates. The deterioration in the quality of the tunnel insulating film 83 is a factor of reducing the amount of channel current.

BRIEF SUMMARY OF THE INVENTION

According to an aspect of the present invention, there is provided a semiconductor device comprising: a semiconductor substrate; and a non-volatile memory cell provided on the semiconductor substrate, the non-volatile memory cell comprising: a tunnel insulating film having a film thickness periodically and continuously changing in a channel width direction of the non-volatile memory cell; a floating gate electrode provided on the tunnel insulating film; a control gate electrode provided above the floating gate electrode; and an interelectrode insulating film provided between the control gate electrode and the floating gate electrode.

According to another aspect of the present invention, there is provided a semiconductor device comprising: a semiconductor substrate; and a non-volatile memory cell provided on the semiconductor substrate, the non-volatile memory cell comprising: a tunnel insulating film having an approximately constant film thickness, a height of an interface between the tunnel insulating film and the semiconductor substrate periodically and continuously changing in a channel width direction of the non-volatile memory cell; a floating gate electrode provided on the tunnel insulating film, a height of an interface between the floating gate electrode and the tunnel insulating film periodically and continuously changing in the channel width direction of the non-volatile memory cell; a control gate electrode above the floating gate electrode; and an interelectrode insulating film provided between the control gate electrode and the floating gate electrode.

According to an aspect of the present invention, there is provided a method of manufacturing a semiconductor device comprising: a semiconductor substrate; an isolation region provided on a surface of the semiconductor substrate and including an isolation trench; and a non-volatile memory cell provided on the semiconductor substrate, the non-volatile memory cell comprising: a tunnel insulating film; a floating gate electrode provided on the tunnel insulating film; a control gate electrode above the floating gate electrode; and an interelectrode insulating film provided between the control gate electrode and the floating gate electrode, the method comprising: forming an insulating film to be processed into the tunnel insulating film on the semiconductor substrate; forming a semiconductor film to be processed into the floating gate electrode on the insulating film; forming the isolation trench by etching the semiconductor film, the insulating film and the semiconductor substrate; and annealing the floating gate electrode, the tunnel insulating film and the semiconductor substrate in water vapor atmosphere.

BRIEF DESCRIPTION OF THE SEVERAL VIEWS OF THE DRAWING

FIG. 3A and FIG. 3B are cross-sectional views showing the process of manufacturing several memory cells of the first embodiment;

FIG. 4A and FIG. 4B are cross-sectional views showing the process of manufacturing the memory cell following FIG. 3A and FIG. 3B, respectively;

FIG. 5A and FIG. 5B are cross-sectional views showing the process of manufacturing the memory cell following FIG. 4A and FIG. 4B, respectively;

FIG. 6A and FIG. 6B are cross-sectional views showing the process of manufacturing the memory cell following FIG. 5A and FIG. 5B, respectively;

FIG. 7 is a characteristic diagram showing temperature dependencies of oxidation reaction factor and water diffusion coefficient;

FIG. 8 is a cross-sectional view showing a memory cell according to a third embodiment of the present invention;

FIG. 12A and FIG. 12B are cross-sectional views showing the process of manufacturing the memory cell following FIG. 11A and FIG. 11B, respectively;

FIG. 13A and FIG. 13B are cross-sectional views showing the process of manufacturing the memory cell following FIG. 12A and FIG. 12B, respectively;

FIG. 14 is a cross-sectional view showing a memory cell according to a fifth embodiment of the present invention;

FIG. 15 is a cross-sectional view showing a conventional memory cell structure;

FIG. 16A and FIG. 16B are cross-sectional views showing the process of manufacturing a silicon substrate for the memory cell of the fifth embodiment;

FIG. 17A and FIG. 17B are cross-sectional views showing a modification example of the fifth embodiment;

FIG. 18 is a cross-sectional view showing a memory cell according to a sixth embodiment of the present invention;

FIG. 19 is a view schematically showing a conventional memory cell structure; and FIG. 20A and FIG. 20B are sectional TEM images (microphotography) of memory cells of the embodiment and a comparative example.

DETAILED DESCRIPTION OF THE INVENTION

Embodiments of the present invention will be described below with reference to the accompanying drawings.

(First Embodiment)

Figure 1:
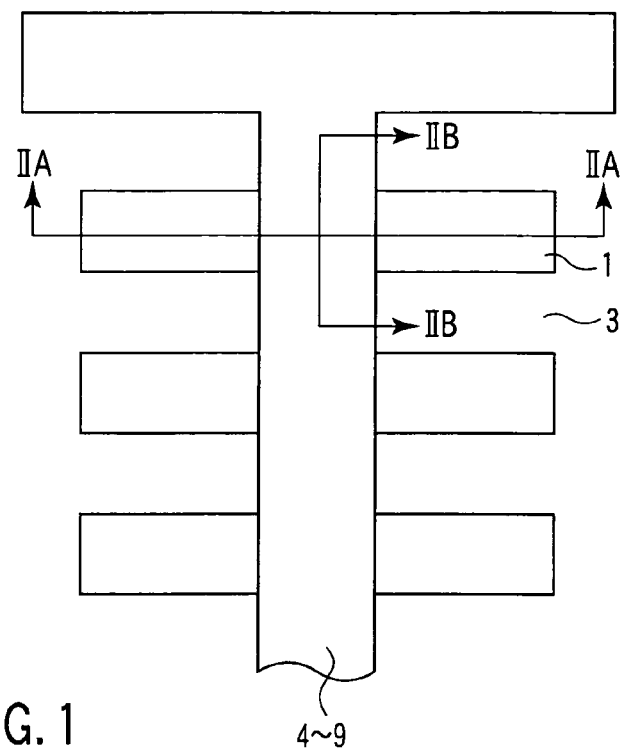
FIG. 1 is a plan view showing a memory cell according to a first embodiment of the present invention.
Figure 2A:
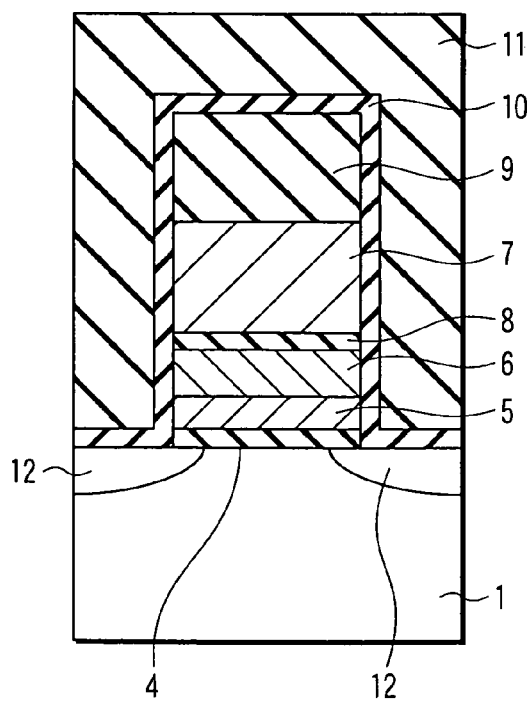
FIG. 2A and FIG. 2B are cross-sectional views taken along a line IIA—IIA of FIG. 1 and a line IIB—IIB thereof, respectively.
Figure 2B:
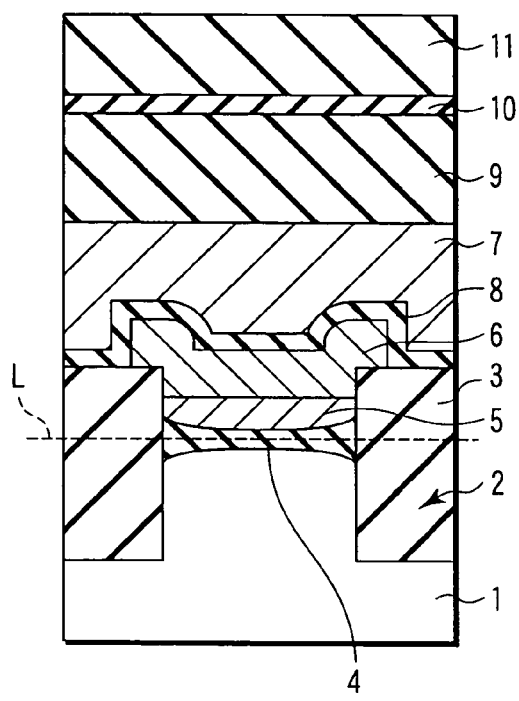

FIG. 1 is a plan view showing a non-volatile memory cell (hereinafter, referred simply to as memory cell) according to a first embodiment of the present invention. FIG. 2A is a cross-sectional view (in a channel length direction) taken along a line IIA—IIA of FIG. 1, and FIG. 2B is a cross-sectional view (in a channel width direction) taken along a line IIB—IIB thereof, respectively.

In the first embodiment, the surface of a silicon substrate 1 is formed with an isolation trench 2, and the isolation trench 2 is filled with an isolation film 3. The upper surface of the isolation film 3 is higher than that of the silicon substrate 1, and is lower than that of a floating gate electrode.

The isolation trench 2 and the isolation film 3 constitute an isolation region. The isolation region defines a semiconductor region (element forming region) including a memory cell channel region.

A tunnel insulating film 4 is provided on the surface of the semiconductor region. The tunnel insulating film 4 includes thicker portions in the vicinity of the isolation film 3. More specifically, the tunnel insulating film 4 has the film thickness distribution below. The film 4 is the thinnest in the vicinity of the center of the channel region, and is thicker the closer to the boundary with-the isolation film 3. In other words, the tunnel insulating film 4 in the vicinity of the boundary with the isolation film 3 has a shape of bird's beak.

In the embodiment, the tunnel insulating film 4 has a thicker portion in the vicinity of the isolation film 3, as shown in FIG. 2B. The thicker portion exists in a section of the channel width direction of memory cell. In the section of the channel width direction, the tunnel insulating film 4 has a vertically symmetrical shape with respect to the center line L parallel to the channel width direction.

As described above, the tunnel insulating film 4 is formed thicker in the vicinity of the boundary with the isolation film 3. Therefore, tunnel current intensively flows through the vicinity of the center of the tunnel insulating film 4. In other words, no tunnel current flows through portions having poor quality in the tunnel insulating film 4.

Floating gate electrodes 5 and 6 are provided on the tunnel insulating film 4. A control gate electrode 7 is provided above the floating gate electrodes 5 and 6. An interelectrode insulating film 8 is provided between the floating gate electrode 5, 6 and the control gate electrode 7.

A silicon nitride film 9 is provided on the control gate electrode 7. The silicon nitride film 9 is used as RIE (Reactive Ion Etching) mask in the process of manufacturing the memory cell.

The tunnel insulating film 4, floating gate electrodes 5 and 6, control gate electrode 7, interelectrode insulating film 8 and silicon nitride film 9 constitute gate structure section. The side and upper surface of the gate structure section is covered with a silicon oxide film 10. The silicon oxide film 10 calls an electrode sidewall oxide film.

A BPSG (Borophosphosilicate Glass) film 11 is provided on the silicon oxide film 10 as an interlayer insulating film. A pair of source/drain regions 12 is provided on the surface of the silicon substrate 1 to hold the gate structure section composed of the foregoing components 4 to 9 between them.

According to the memory cell structure in the first embodiment, the tunnel current intensively flows through the vicinity of center of the channel of the tunnel insulating film 4 having relatively good quality in the write/erase operation. However, no tunnel current flows through portions having remarkably poor quality, that is, portions near to the boundary with the isolation film in the tunnel insulating film.

Therefore, the generation of charge traps or leakage current is greatly reduced in the tunnel insulating film 4. As a result, it is possible to effectively prevent malfunction or reduction of charge storage capability due to threshold voltage variations in the memory cell.

According to the first embodiment, the following effect is also obtained.

In the write/erase operation, the relationship between a voltage (operating voltage) Vcg applied to the control gate electrode and a voltage Vtd applied to the tunnel insulating film is as follows. The relationship is expressed by the following equation using capacitances of the tunnel and interelectrode insulating film Ctd and Cid in the memory cell.

$$Vtd=(Cid/(Ctd+Cid))\times Vcg$$

The following consideration is given from the foregoing equation. In order to reduce the operating voltage Vcg, the surface areas of the interelectrode insulating film 8 is three-dimensionally increased to make the interelectrode insulating film capacitance Cid large. However, according to the method described above, it is difficult to lower the operating voltage Vcg. This also hinders the scale-down of the memory cell. The reason why the foregoing method is hard to make low the operating voltage Vcg is as follows.

In order to increase the surface areas of the interelectrode insulating film 8, the interelectrode insulating film 8 must be formed into a complicate surface shape. In order to obtain the foregoing complicate surface shape, the floating gate electrodes 5 and 6 under the interelectrode insulating film 8 must be formed into a complicate surface shape.

However, there is a limitation in the technique of. microfabricating the floating gate electrodes 5 and 6, that is, polysilicon film. For this reason, there is also a limitation in making the complicated surface shape of the floating gate electrodes 5 and 6. Therefore, it is difficult to make low the operating voltage Vcg by increasing the surface areas of the interelectrode insulating film 8.

In addition, when the interelectrode insulating film capacitance Cid increases, parasitic capacitance between floating gate electrodes also increases. When the parasitic capacitance increases, malfunction is tend to occur easily. This is one of factors that makes lowering the operating voltage Vcg. difficult.

On the contrary, the memory cell of the embodiment has the structure in which the tunnel insulating film 4 is formed thicker in the vicinity of the boundary with the isolation film 3. Thus, the tunnel insulating film capacitance(capacitance of tunnel dielectrics) Ctd reduces. As a result, the operating voltage Vcg is readily lowered, so that the scale-down of the memory cell can be realized.

FIG. 3A and FIG. 3B to FIG. 6A and FIG. 6B are cross-sectional views showing the process of manufacturing the memory cell of the present embodiment.

As shown in FIG. 3A and FIG. 3B, the surface of the silicon substrate 1 doped with desired impurity is formed with the tunnel insulating film having a thickness of 10 nm by thermal oxidation. Thereafter, the following films are successively deposited by low pressure CVD (Chemical Vapor Deposition) process. One is a polysilicon film 5 functioning as the bottom floating gate electrode in a lower level and having a thickness of 30 nm. Another is a silicon nitride film 13 functioning as a stopper for CMP (Chemical Mechanical Polishing) and having a thickness of 50 nm. Another is a silicon oxide film 14 functioning as a RIE mask and having a thickness of 200 nm.

In the first embodiment, the silicon thermal oxide film is used as the tunnel insulating film; however, the present invention is not limited to the embodiment. For example, a silicon thermal oxynitride film may be used.

As illustrated in FIG. 3A and FIG. 3B, the silicon oxide film 14 is etched by RIE process using a resist as a mask (not shown) covering the element forming region as the mask. The resist pattern is transferred to the silicon oxide film 14.

As depicted in FIG. 3A and FIG. 3B, the silicon nitride film 13, polysilicon film 5 and tunnel insulating film 4 are successively etched by RIE process using the resist and the silicon oxide film 14 as the mask. The exposed region of the silicon substrate 1 is further etched so that the isolation trench 2 having a depth of 200 nm can be formed.

The foregoing resist disappears in the RIE process, and thereafter, the silicon oxide film 14 is used as the RIE mask.

As seen from FIG. 4A and FIG. 4B, the exposed silicon surface is formed with a silicon oxide film (not shown) having a thickness of 5 nm by thermal oxidation. Thereafter, the isolation film 3, that is, a silicon oxide film (CVD oxide film) having a thickness of 400 nm is deposited on the entire surface by plasma CVD process. In this case, the silicon oxide film is deposited so that the isolation trench 2 can be fully filled.

As shown in FIG. 4A and FIG. 4B, unnecessary portions of the CVD oxide film are removed by CMP process using the silicon nitride film 13 as the stopper. Thus, the isolation film 3 having a predetermined shape is obtained while the silicon oxide film (RIE mask) 14 is removed. The CMP process is carried out until the silicon nitride film 13 is exposed and the surface is planarized.

As illustrated in FIG. 5A and FIG. 5B, the silicon nitride film 13 is removed by etching using phosphoric acid solution. Thereafter, the upper level floating gate electrode 6, that is, a polysilicon film having a thickness of 50 nm is deposited on the entire surface by low pressure CVD process. The polysilicon film is etched by RIE process using resist mask (not shown) so that a slit 15 dividing the polysilicon film in the bit line direction can be formed. In this way, the floating gate electrode 6 having a determined shape in the bit line direction is obtained.

Actually, a plurality of floating gate electrodes 6 are formed by RIE process; however, one floating gate electrode is only shown in FIG. 5.

Thereafter, the surface of the floating gate electrode 6 is nitrified by annealing in low-pressure ammonia atmosphere of 1 kPa at temperature of 900° C. for 30 minutes. The annealing is carried out for preventing the upper surface of the floating gate electrode (polysilicon film) 6 from being oxidized by the later annealing.

Further, an annealing (water vapor (steam) annealing) is carried out in water vapor atmosphere at temperature of 700° C. for 10 minutes.

In this annealing, water vapor ($H_2O$) diffuses in the isolation film (silicon oxide film) 3 via the slit 15, and reaches the tunnel insulating film 4. The water vapor reaching the tunnel insulating film 4 makes oxidation reaction with the upper surface of the silicon substrate 1 and the lower surface of the floating gate electrode (polysilicon film) 5.

As a result, the tunnel insulating film 4 is obtained having the following film thickness distribution. As seen from FIG. 5A and FIG. 5B, the tunnel insulating film 4 is the thinnest in the vicinity of the center of the channel region, and thicker near the boundary with the isolation film 3.

The water vapor annealing serves to reduce process damage in the tunneling insulating film 4 induced by RIE process carried out in the process of forming isolation trench and gate electrode. The reason is that the Si—O bond in the tunnel insulating film 4 broken by the RIE process is recombined by oxygen supplied during the water vapor annealing.

In the embodiment, water vapor annealing is carried out after the slit 15 is formed; however, the present invention is not limited to that embodiment. For example, water vapor annealing may be carried out after the isolation trench 2 is formed (see FIG. 3A and FIG. 3B) or the isolation film 3 is formed (see FIG. 4 and FIG. 4B).

In order to sufficiently repair the device receiving process damage, it is desirable that water vapor annealing is carried out after the slit 15 is formed. Because, process damage (resulting from RIE process) caused in the gate electrode forming process is also effectively reduced.

A comparison is made between diffusion of water vapor to the isolation film (silicon oxide film) 3 and oxidation reaction with water vapor and the floating gate electrode (polysilicon film) 5. In this case, when the water vapor annealing temperature is lowered, the diffusion is easy to occur as compared with the oxidation reaction.

This is evident from the following fact. As seen from FIG. 7, the bird's beak length L1 of the tunnel insulating film is larger than a decrease L2 of the width of silicon substrate or floating gate electrode below a certain temperature Tc. In this case, the bird's beak length L1 means temperature dependency of diffusion coefficient D relating to the foregoing diffusion. The decrease L2 means temperature dependency of oxidation-reaction-rate-constant k relating to the foregoing oxidation.

Therefore, when the water vapor annealing temperature is lower, sufficient amount of water is readily supplied from the boundary between the tunnel insulating film 4 and the isolation film 3 to the central portion of the film 4. In other words, when the water vapor annealing temperature is lower, the tunnel insulating film 4 having the film thickness distribution of the embodiment is easily obtained.

According to the study by the present inventors, the following fact was found to form the tunnel insulating film 4 having a shape to cause the effect of the embodiment sufficiently. Namely, it is preferable that water vapor annealing temperature is set less than 750° C. if the channel width is 0.2 μm or less.

Well-known memory cell manufacturing process follows the process shown in FIG. 5A and FIG. 5B.

First, the interelectrode insulating film 8, that is, a three-layer structure insulating film is formed on the entire surface by low pressure CVD process. The three-layer structure insulating film is composed of silicon oxide film/silicon nitride film/silicon oxide film, and has a thickness of 15 nm. The control gate electrode 7, that is, a two-layer structure conductive film is formed on the three-layer structure insulating film by low pressure CVD process. The two-layer structure conductive film is composed of polysilicon film/tungsten silicide film, and has a thickness of 100 nm.

A resist mask is formed on the silicon nitride film, and the silicon nitride film is etched by RIE process using the resist mask as the mask. Thus, the silicon nitride film 9 is obtained having the pattern corresponding to the gate structure section.

The three-layer structure insulating film, two-layer structure conductive film, floating gate electrode 6; 5 and tunnel insulating film 4 are successively etched by RIE process using the resist mask and the silicon nitride film as the mask. In this manner, a slit 16 in the word line direction is formed, as shown in FIG. 6A and FIG. 6B. In this way, the shape of floating gate electrodes 5; 6 and control gate electrode 7 is defined.

The silicon oxide film (electrode sidewall oxide film) 10 is formed using thermal oxidation and CVD process, and thereafter, the source/drain region 12 is formed using ion implantation and annealing. Then, the BPSG film 11 is formed as the interlayer insulating film by low pressure CVD process, and thus, the memory cell shown in FIG. 2A and FIG. 2B is obtained. Thereafter, the process of forming interconnects and the like follows, and the memory cell is completed.

FIG. 20A and FIG. 20B show sectional TEM images of the present embodiment and a comparative example. FIG. 20A shows a sectional TEM image of the comparative example; and FIG. 20B shows a sectional TEM image of the present embodiment. The comparative example differs from the present embodiment in that water vapor annealing of the present embodiment is not carried out. In the present embodiment, the tunnel insulating film 4 has a thickness of about 8 nm at the channel central portion, and becomes thicker near the boundary with the isolation film 3. More specifically, the tunnel insulating film 4 has a thickness if about 15 nm in the vicinity of the boundary with the isolation film 3.

A charge storage test at temperature of 150° C. for two hours was made with respect to each memory cell of the present embodiment and the comparative example. As a result, the memory cell threshold voltage variation of the present embodiment was 0.18V; on the other hand, that of the comparative example was 0.50V. Therefore, the effectiveness of the present embodiment was proved.

In addition, the tunnel insulating film capacitance of each memory cell of the present embodiment and the comparative example was investigated. As a result, the tunnel insulating film capacitance of each memory cell of the present embodiment is about 20% lower than that of the comparative example.

In addition, a coupling ratio of each memory cell of the present embodiment and the comparative example are investigated. The coupling ratio is defined by Cie/(Ctd+Cie). The coupling ratio of the memory cell of the present invention was about 5% higher than that of the comparative example.

(Second Embodiment)

The second embodiment will be described with reference to the accompanying drawings used in the first embodiment.

As shown in FIG. 3A and FIG. 3B, the surface of the silicon substrate 1 doped with desired impurity is formed with the tunnel insulating film having a thickness of 10 nm by thermal oxidation. Thereafter, the following films are successively deposited by low pressure CVD (Chemical Vapor Deposition) process. One is a polysilicon film 5 functioning as a lower layer floating gate electrode and having a thickness of 30 nm. Another is a silicon nitride film 13 functioning as the stopper for CMP (Chemical Mechanical Polishing) and having a thickness of 50 nm. Another is a silicon oxide film 14 functioning as RIE mask and having a thickness of RIE mask.

As illustrated in FIG. 3A and FIG. 3B, the silicon oxide film 14 is etched by RIE process using a resist as a mask (not shown) covering the element forming region as the mask. The resist pattern is transferred to the silicon oxide film 14.

As depicted in FIG. 3A and FIG. 3B, the silicon nitride film 13, polysilicon film 5 and tunnel insulating film 4 are successively etched by RIE process using the resist and the silicon oxide film 14 as the mask. The exposed region of the silicon substrate 1 is further etched so that the isolation trench 2 having a depth of 200 nm can be formed.

The foregoing resist disappears in the RIE process, and thereafter, the silicon oxide film 14 is used as the RIE mask.

As seen from FIG. 4A and FIG. 4B, the exposed silicon surface is formed with a silicon oxide film (not shown) having a thickness of 5 nm by thermal oxidation. Thereafter, the isolation film 3, that is, a silicon oxide film (CVD oxide film) having a thickness of 400 nm is deposited on the entire surface by plasma CVD process. In this case, the silicon oxide film is deposited so that the isolation trench 2 can be fully filled.

As shown in FIG. 4A and FIG. 4B, unnecessary portions of the CVD oxide film are removed by CMP process using the silicon nitride film 13 as the stopper. Thus, the isolation film 3 having a predetermined shape is obtained while the silicon oxide film (RIE mask) 14 is removed. The CMP process is carried out until the silicon nitride film 13 is exposed and the surface is planarized.

Annealing is carried out under water vapor atmosphere containing heavy water ($D_2O$) in low pressure of 2.6 kPa at temperature of 650° C. for 30 minutes.

In this annealing, heavy water ($D_2O$) diffuses in the isolation film (silicon oxide film) 3, and reaches the tunnel insulating film 4. The heavy water makes oxidation reaction with the upper surface of the silicon substrate 1 and the lower surface of the floating gate electrode (polysilicon film) 5.

As a result, the tunnel insulating film 4 is obtained having the following film thickness distribution. Namely, the tunnel insulating film 4 is the thinnest in the vicinity of the center of the channel region, and thicker near the boundary with the isolation film 3.

As illustrated in FIG. 5A and FIG. 5B, the silicon nitride film 13 is removed by etching using phosphoric acid solution. Thereafter, the upper layer floating gate electrode 6, that is, a polysilicon film having a thickness of 50 nm is deposited on the entire surface by low pressure CVD process. The polysilicon film is etched by RIE process using resist mask (not shown) so that a slit 15 dividing the polysilicon film in the bit line direction can be formed. In this way, the floating gate electrode 6 having a determined shape in the bit line direction is obtained.

Actually, a plurality of floating gate electrodes 6 are formed by RIE process; however, one floating gate electrode is only shown in FIG. 5.

Well-known memory cell manufacturing process follows the process shown in FIG. 5A and FIG. 5B, like the first embodiment.

A charge storage test at temperature of 150° C. for two hours was made with respect to each memory cell of the present embodiment and the comparative example. As a result, the memory cell voltage threshold variation of the present embodiment was 0.16V; on the other hand, that of the comparative example is 0.27V. As seen from the result described above, the memory cell of the present embodiment has smaller threshold voltage variation than that of the comparative example. Therefore, the effectiveness of the present embodiment was proved. In other words, it is proven experimentally that the heavy water annealing is more effective than water vapor annealing. Besides, the same effect as the first embodiment is obtained.

In the second embodiment, water vapor annealing is carried out after the surface of the isolation film 3 is planarized; however, the present invention is not limited to that embodiment. For example, water vapor annealing may be carried out after the slit 15 is formed or the isolation trench 2 is formed.

(Third Embodiment)

FIG. 8 is a cross-sectional view showing a memory cell according to a third embodiment of the present invention.

FIG. 8 is a cross-sectional view in a channel width direction equivalent to FIG. 2B. In FIG. 8, the same reference numerals as FIG. 2B are given to designate portions corresponding to FIG. 2B, and the details are omitted. In the following drawings, the same reference numerals as used in the preceding drawings show the identical and corresponding portion, and the details are omitted.

The present embodiment differs from the first embodiment in the following point. The boundaries $4p1$ and $4p2$ between the tunnel insulating film 4 and the isolation film 3 get in between the floating gate electrode 5 and the isolation film 3 and between the isolation film 3 and the silicon substrate 1, respectively. As a result, the tunnel insulating film 4 is thicker in the vicinity of the boundary with the isolation film 3.

As seen from FIG. 8, the first boundary $4p1$ of the tunnel insulating film 4 exists (is gotten into) between the lower side of the floating gate electrode 5 and the isolation film 3 to contact with those in the channel width direction section.

In the first boundary $4p1$ of the tunnel insulating film 4, the dimension in the channel width direction increases gradually toward the downward direction (closer to the silicon substrate 1). In the floating gate electrode 5 contacting with the first boundary $4p1$ of the tunnel insulating film 4, the dimension in the channel width direction reduces gradually toward the downward direction.

On the other hand, the second boundary $4p2$ of the tunnel insulating film 4 exists (is gotten into) between the upper side of the semiconductor region (element forming region) of the silicon substrate 1 defined by isolation regions 2 and 3 and the isolation film 3 to contact with them.

In the second boundary $4p2$ of the tunnel insulating film 4, the dimension in the channel direction increases gradually toward the upward direction (closer to the floating gate electrode 5). In the element forming region contacting with the second boundary $4p2$ of the tunnel insulating film 4, the dimension in the channel width direction reduces gradually toward the upward direction.

In the memory cell structure of the embodiment, the intensity of electric field generated in the upper edge of the element forming region and the lower edge of the floating gate electrode 5 reduce in the write/erase operation. In other words, it is possible to relax the electric field (electric field concentration) of the tunnel insulating film 4 having the lowest quality, that is, the boundary with the isolation film 3. Therefore, no charge trap occurs in the boundary with the isolation film 3, so that malfunction by memory cell threshold variation can be effectively prevented.

In order to realize the memory cell structure in the third embodiment, a high-temperature water vapor annealing at 900° C. or higher temperature is carried out before or after a low-temperature water vapor annealing (first heat treatment) of the first embodiment. A lamp annealing in mixed gas atmosphere of hydrogen and oxygen is given as the high-temperature water vapor annealing.

A comparison is made between diffusion of water vapor to the isolation film (silicon oxide film) 3 and oxidation reaction with the water vapor and the floating gate electrode (polysilicon film) 5. In high-temperature water vapor annealing, the oxidation reaction is easy to occur as compared with the diffusion (see FIG. 7). Therefore, the upper edge of the element forming region and the lower edge of the floating gate electrode 5 in the vicinity of the boundary with the isolation film 3 are effectively oxidized. In this way, the tunnel insulating film 4 of the present embodiment is readily obtained.

According to the study by the present inventors, it was revealed that the high-temperature water vapor annealing temperature is preferably 900° C. or higher in order to form the tunnel insulating film 4 of the present embodiment.

(Fourth Embodiment)

Figure 9A:
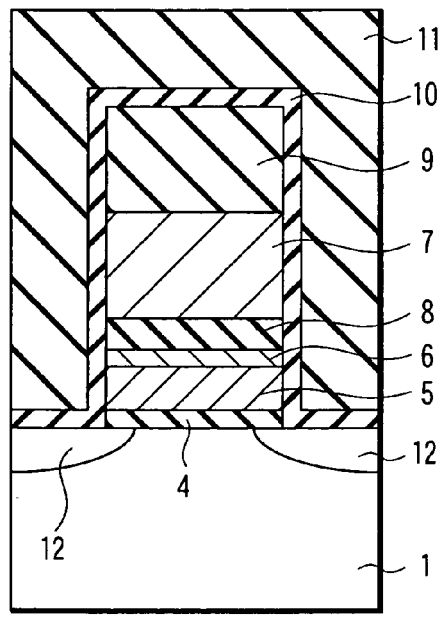
FIG. 9A and FIG. 9B are cross-sectional views showing a memory cell according to a fourth embodiment of the present invention.
Figure 9B:
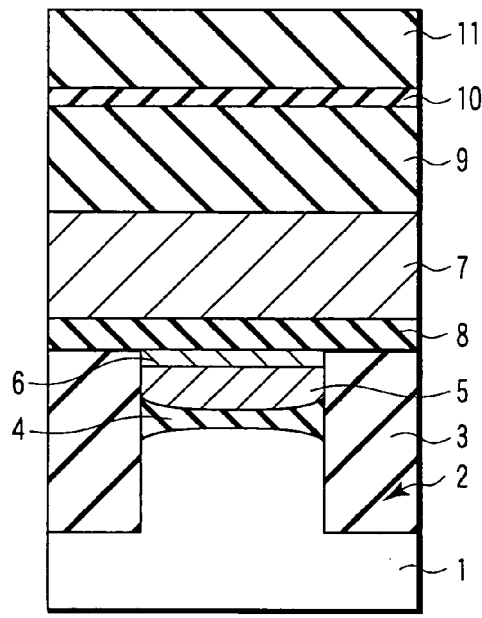

FIG. 9A and FIG. 9B are cross-sectional views showing a memory cell according to a fourth embodiment of the present invention. FIG. 9A and FIG. 9B are cross-sectional views in the channel length and width direction, respectively, equivalent to FIG. 2A and FIG. 2B.

The fourth embodiment differs from the first to third embodiments in the following point. Out off the upper and side surfaces of the floating gate electrodes 5 and 6, only upper surface is covered with the interelectrode insulating film 8.

According to the memory cell structure described above, no interelectrode insulating film 8 exists on the side surface of floating gate electrodes 5 and 6. Therefore, cell to cell variation in the capacitance of the interelectrode insulating film 8 is reduced as compared with the conventional memory cell shown in FIG. 19.

As described above, the present embodiment has the structure in which only upper surface is covered with the interelectrode insulating film 8 out of the upper and side surfaces of the floating gate electrodes 5 and 6. In order to realize the structure, a structure without the floating gate electrode above from the isolation film 3 is employed. As a result, the thickness of the floating gate electrode 5; 6 is thinner than the conventional memory cell shown in FIG. 19, so that the parasitic capacitance between adjacent floating gate electrodes can be reduced. In this way, malfunction of the memory cell is prevented.

Besides, the same effect as the first embodiment is obtained.

FIG. 10A and FIG. 10B to FIG. 13A and FIG. 13B are cross-sectional views showing the process of manufacturing the memory cell according to the fourth embodiment.

Figure 10A:
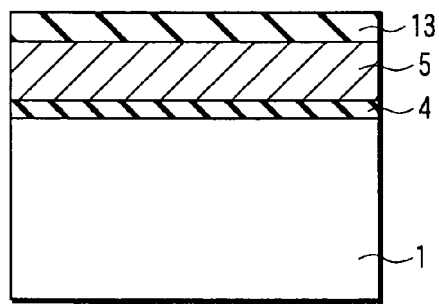
FIG. 10A and FIG. 10B are cross-sectional views showing the process of manufacturing the memory cell of the fourth embodiment.
Figure 10B:
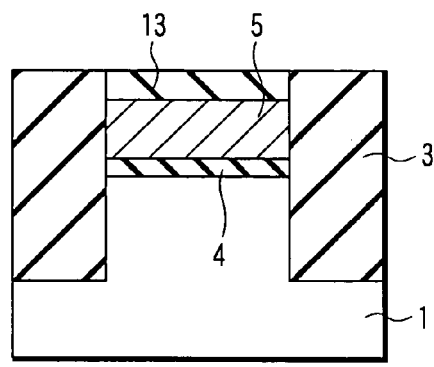

The processes from FIG. 3A and FIG. 3B to FIG. 4A and FIG. 4B are carried out. FIG. 10A and FIG. 10B show cross-sectional views in this stage.

Figure 11A:
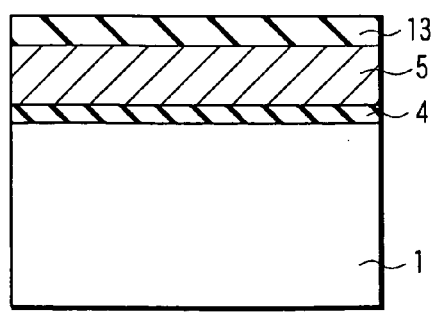
FIG. 11A and FIG. 11B are cross-sectional views showing the process of manufacturing the memory cell following FIG. 10A and FIG. 10B, respectively.
Figure 11B:
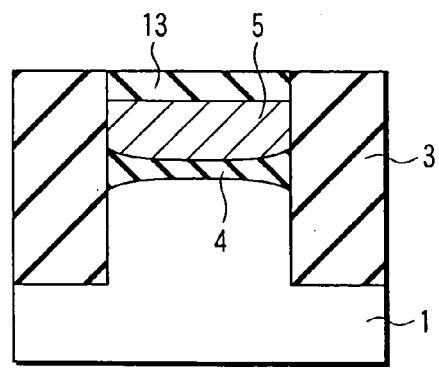

As illustrated in FIG. 11A and FIG. 11B, an annealing (water vapor annealing) is carried out in water vapor atmosphere at temperature 750° C. for 10 minutes, like the first embodiment. In this way, it is possible to form the tunnel insulating film 4 having the film thickness distribution below. Namely, the film 4 is the thinnest in the vicinity of the center of the channel region, and is thicker in the vicinity of the boundary with the isolation film 3. The details of the foregoing annealing are as described in the first embodiment.

As depicted in FIG. 12A and FIG. 12B, the silicon nitride film 13 is removed by etching using phosphoric acid solution. Thereafter, the floating gate electrode 6 is formed in the trench which is formed by removing the silicon nitride film 13, and the surface is planarized.

The floating gate electrode 6 is formed by low pressure CVD and CPM processes of the polysilicon film.

The floating gate electrode 6 is embedded in the trench formed by removing the silicon nitride film 13. Therefore, the side surface of the floating gate electrode 6 is not exposed, and only upper surface thereof is exposed.

As seen from FIG. 13A and FIG. 13B, interelectrode insulating film 8, control gate electrode 7 and silicon nitride film 9 are formed by the same processes as the first embodiment.

Since the side surface of the floating gate electrode 6 is not exposed, the side surface is not coated with the interelectrode insulating film 8, and only upper surface of the floating gate electrode 6 is coated with the film 8.

The surface of the region including floating gate electrode 6 and isolation film 3 is flat; therefore, the surface of the interelectrode insulating film 8 on the floating gate electrode 6 is also made flat. In other words, the surface of the interelectrode insulating film 8 on the floating gate electrode 6 is approximately flush with that on the insulating film 3.

The silicon oxide film (electrode sidewall oxide film) 10 is formed using thermal oxidation and CVD processes, and thereafter, the source/drain region 12 is formed using ion implantation and annealing. Then, the BPSG film 11 is formed as an interlayer insulating film by low pressure CVD process, and thus, the memory cell shown in FIG. 9A and FIG. 9B is obtained. Thereafter, the process of forming interconnects and the like follows, and the memory cell is completed.

The interelectrode insulating film 8 may not need to cover exactly only upper surface of the floating gate electrode 6. The effect of the embodiment is obtained as long as the following condition is satisfied. The area S1 of the side surface of the floating gate electrode 6 coated with the interelectrode insulating film 8 is smaller than the area S2 of the upper surface of the same as above (e.g., $100 \times (S1/S2) \leq 5\%$).

In addition, the surface of the interelectrode insulating film 8 on the floating gate electrode 6 does not need to be flush with that on the insulating film 3.

The upper surface of the isolation film 3 may be situated above upper surface of the floating gate electrode 6. The surface of the interelectrode insulating film 8 on the insulating film 3 may be situated higher than that of the floating gate electrode 6. The effect is obtained even if the structure described above is given.

In order to secure normal write/erase operation, it is desirable that the interelectrode insulating film 8 is an insulating film having a permittivity higher than that of the silicon oxide film. Thus, it is preferable that a silicon nitride film is used in view of the reduction of manufacturing cost and preventing the degradation of tunnel insulating film characteristic.

It is desirable that the silicon nitride film used as the interelectrode insulating film 8 is formed by radical nitriding process. Because, the silicon nitride film formed by the conventional low-pressure CVD process has high charge trap density. Thus, such a silicon nitride film is a factor of causing malfunction.

If it is difficult to form the silicon nitride having desired thickness by the radical nitriding process, radical nitriding, silicon nitride deposition and radical nitriding are successively carried out. In this way, it is possible to the silicon nitride (first silicon nitride film/second silicon nitride film/third silicon nitride film) having desired thickness.

In this case, the first and third silicon nitride films are silicon nitride films (radical silicon nitride film) formed by radical nitriding. The second silicon nitride film is a silicon nitride film (deposited silicon nitride film) formed by silicon nitride deposition.

The radical silicon nitride film has lower charge trap density and smaller leakage current as compared with the deposited silicon nitride film. Namely, the radical silicon nitride film has better quality than the deposited silicon nitride film.

Therefore, the upper and lower surfaces of the second silicon nitride film contact with the first and third silicon nitride films having low charge trap density. In other words, both top and bottom interfaces of the second silicon nitride film consist of the first and third silicon nitride films having good quality.

In this way, malfunction resulting from charge trap is prevented even if the silicon nitride film formed by the foregoing process (radical nitriding, silicon nitride deposition and radical nitriding) is used as the interelectrode insulating film 8.

(Fifth Embodiment)

FIG. 14 is a cross-sectional view showing a memory cell according to a fifth embodiment of the present invention. FIG. 14 is a cross-sectional view in the channel width direction equivalent to FIG. 2B.

The fifth embodiment differs from the first to fourth embodiments in that the thickness of the tunnel insulating film 4 periodically and continuously changes in the channel width direction. As seen from FIG. 14, the interface between the silicon substrate 1 and the tunnel insulating film 4 undulates, and thereby, the thickness of the tunnel insulating film 4 periodically and continuously changes.

The memory cell structure of the embodiment includes the following different regions. One is a region (channel current region) 20 where channel current flows in the cell transistor operation. Another is a region (tunnel current region) 21 where tunnel current flows in the write/erase operation. In addition, the channel current region 20 has the larger area than the tunnel current region 21.

Thus, even if quality degradation such as the generation of charge trap or interface state occurs in the tunnel insulating film 4 when the tunnel current passes, the influence to the channel current is reduced. As a result, characteristic variations of the memory cell are greatly suppressed.

According to the study by the present inventors, the following fact was revealed. Namely, it is desirable that the difference between the maximum and minimum thickness of the tunnel insulating film 4 is set more than 10%.

On the contrary, in the conventional memory cell structure, the channel and tunnel current regions 20 and 21 are substantially the same, as seen from FIG. 15. For this reason, quality degradation such as the generation of charge trap or interface state occurs in the tunnel insulating film 4 by the passage of the tunnel current. As a result, there is a problem that the amount of channel current is reduced inevitably. This is a factor of causing characteristic variations of memory cell.

The memory cell of the embodiment is realized by forming the tunnel insulating film 4 on the silicon substrate 1 having the surface whose height periodically and continuously changes.

FIG. 16A and FIG. 16B are cross-sectional views showing the process of manufacturing the silicon substrate 1 having the surface described above.

As shown in FIG. 16A, a silicon substrate 1 whose main surface is (110) plane is prepared. In FIG. 16A and FIG. 16B, a surface 30 functioning as a cleavage plane is schematically shown by a dotted line.

The surface of the silicon substrate 1 is etched using alkaline solution.

In this case, a specific crystal plane is selectively etched, and as shown in FIG. 16, the silicon substrate 1 having a saw-tooth-shaped surface is obtained.

Thereafter, the surface of the silicon substrate 1 is subjected to high-temperature oxidation, and thereby, the silicon substrate 1 shown in FIG. 14 is obtained.

FIG. 17A and FIG. 17B are cross-sectional views showing a memory cell according to a modification example of the fifth embodiment. A memory cell shown in FIG. 17 has the following structure. Namely, the interface between the tunnel insulating film 4 and the floating gate electrode 5 undulates, and thereby, the thickness of the tunnel insulating film 4 periodically and continuously changes.

In addition, the structure shown in FIG. 17B may be employed. Namely, both interfaces between the tunnel insulating film 4 and the floating gate electrode 5 and between the silicon substrate 1 and the tunnel insulating film 4 undulate. In this way, the thickness of the tunnel insulating film 4 periodically and continuously changes.

The memory cells of the modification example can obtain the same effect as the fifth embodiment. In addition, it is desirable that the thickness difference of the tunnel insulating film 4 is set more than 10%, like the present embodiment.

(Sixth Embodiment)

FIG. 18 is a cross-sectional view showing a memory cell according to a sixth embodiment of the present invention. FIG. 18 is a cross-sectional view in the channel width direction equivalent to FIG. 2B.

The sixth embodiment differs from the fifth embodiment in the following point. The thickness of the tunnel insulating film 4 is approximately constant. In addition, the height of both interfaces between the tunnel insulating film 4 and the floating gate electrode 5 and between the silicon substrate 1 and the tunnel insulating film periodically and continuously changes in the channel width direction.

The memory cell structure of the embodiment includes the following different regions. One is a channel current region 20, and another is a region (write tunnel current region) 21w where tunnel current flows in the write operation. Another is a region (erase tunnel current region) 21e where tunnel current flows in the erase operation. In addition, the channel current region 20 has the larger area than the write tunnel current region 21w. The channel current region 20 is different from the erase tunnel current region 21e.

Thus, even if quality degradation such as the generation of charge trap or interface state occurs in the tunnel insulating film 4 when the tunnel current passes, there is almost no influence to the channel current. As a result, characteristic variations of the memory cell are greatly suppressed.

According to the study by the present inventors, the following fact was revealed. Namely, it is desirable that the difference between the maximum and minimum thickness of the tunnel insulating film 4 is set more than 10%.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising: a semiconductor substrate; an isolation region provided on a surface of the semiconductor substrate and including an isolation trench; and a non-volatile memory cell provided on the semiconductor substrate, the non-volatile memory cell comprising: a tunnel insulating film; a floating gate electrode provided on the tunnel insulating film; a control gate electrode above the floating gate electrode; and an interelectrode insulating film provided between the control gate electrode and the floating gate electrode, the method comprising:

forming an insulating film to be processed into the tunnel insulating film on the semiconductor substrate;

forming a semiconductor film to be processed into the floating gate electrode on the insulating film;

forming the isolation trench by etching the semiconductor film, the insulating film and the semiconductor substrate; and annealing the floating gate electrode, the tunnel insulating film and the semiconductor substrate in water vapor atmosphere.

2. The method of manufacturing the semiconductor device according to claim 1, wherein the tunnel insulating film includes a portion whose thickness increases gradually toward the isolation region.

3. The method of manufacturing the semiconductor device according to claim 2, wherein the portion whose thickness increases gradually toward the isolation region exists in a channel width direction section of the non-volatile memory cell.

4. The method of manufacturing the semiconductor device according to claim 3, wherein an upper surface of the isolation region is higher than the surface of the semiconductor substrate, and lower than an upper surface of the floating gate electrode, and the tunnel insulating film includes a first portion and a second portion in the channel width direction section of the non-volatile memory cell after the annealing the floating gate electrode, the tunnel insulating film and the semiconductor substrate in the water vapor atmosphere, the first portion being gotten into between the lower side of the floating gate electrode and the isolation region, the second portion being gotten into between the upper side of a semiconductor region of the semiconductor substrate defined by the isolation region and the isolation region.

5. The method of manufacturing the semiconductor device according to claim 4, wherein the first portion of the tunnel insulating film has a dimension becoming gradually larger toward a downward direction in the channel width direction, the floating gate electrode contacting with the first portion of the tunnel insulating film has a dimension becoming gradually smaller toward the downward direction in the channel width direction, the second portion of the tunnel insulating film has a dimension becoming gradually larger toward an upward direction in the channel width direction, and the semiconductor region contacting with the second portion of the tunnel insulating film has a dimension becoming gradually smaller toward a downward direction of the semiconductor region in the channel width direction.

6. The method of manufacturing the semiconductor device according to claim 2, wherein an upper surface of the isolation region is higher than the surface of the semiconductor substrate, and lower than an upper surface of the floating gate electrode, and the tunnel insulating film includes a first portion and a second portion in the channel width direction section of the non-volatile memory cell after the annealing the floating gate electrode, the tunnel insulating film and the semiconductor substrate in the water vapor atmosphere, the first portion being gotten into between the lower side of the floating gate electrode and the isolation region, the second portion being gotten into between the upper side of a semiconductor region of the semiconductor substrate defined by the isolation region and the isolation region.

7. The method of manufacturing the semiconductor device according to claim 2, wherein the water vapor atmosphere includes heavy water vapor.

8. The method of manufacturing the semiconductor device according to claim 1, wherein the water vapor atmosphere includes heavy water vapor.

9. The method of manufacturing the semiconductor device according to claim 2, wherein the annealing the floating gate electrode, the tunnel insulating film and the semiconductor substrate includes a first heat treatment which is carried out under a condition that water diffusion rate in the tunnel insulating film is larger than oxidative reaction rate of the water with the floating gate electrode and oxidative reaction rate of the water with the semiconductor substrate.

10. The method of manufacturing the semiconductor device according to claim 6, wherein the first portion of the tunnel insulating film has a dimension becoming gradually larger toward a downward direction in the channel width direction, the floating gate electrode contacting with the first portion of the tunnel insulating film has a dimension becoming gradually smaller toward the downward direction in the channel width direction, the second portion of the tunnel insulating film has a dimension becoming gradually larger toward an upward direction in the channel width direction, and the semiconductor region contacting with the second portion of the tunnel insulating film has a dimension becoming gradually smaller toward a downward direction of the semiconductor region in the channel width direction.

11. The method of manufacturing the semiconductor device according to claim 1, wherein the annealing the floating gate electrode, the tunnel insulating film and the semiconductor substrate includes a first heat treatment which is carried out under a condition that water diffusion rate in the tunnel insulating film is larger than oxidative reaction rate of the water with the floating gate electrode and oxidative reaction rate of the water with the semiconductor substrate.

12. The method of manufacturing the semiconductor device according to claim 11, wherein the tunnel insulating film comprises silicon oxide or silicon oxynitride, the floating gate electrode comprises polysilicon, the semiconductor substrate comprises silicon, and the first heat treatment is carried out at temperature of 750° C. or less.

13. The method of manufacturing the semiconductor device according to claim 11, wherein the annealing the floating gate electrode, the tunnel insulating film and the semiconductor substrate includes a second heat treatment which is carried out under a condition that water diffusion rate in the tunnel insulating film is smaller than oxidative reaction rate of the water with the floating gate electrode and oxidative reaction rate of the water with the semiconductor substrate.

14. The method of manufacturing the semiconductor device according to claim 13,
wherein the tunnel insulating film comprises silicon oxide or silicon nitride, the floating gate electrode comprises polysilicon, the semiconductor substrate comprises silicon, and the second heat treatment is carried out at temperature of 900° C. or more.

15. The method of manufacturing the semiconductor device according to claim 1,
wherein the floating gate electrode has an upper surface and a side surface, the only upper surface between the surfaces is essentially covered with the interelectrode insulating film, the process of forming the interelectrode insulating film includes a first radical nitration process.

16. The method of manufacturing the semiconductor device according to claim 15,
wherein forming the interelectrode insulating film includes a silicon nitride deposition process carried out after the first radical nitriding process and a second radical nitriding process carried out after the silicon nitride deposition process.

* * * * *